United States Patent
Buchmann et al.

(10) Patent No.: US 9,252,785 B2
(45) Date of Patent: Feb. 2, 2016

(54) CLOCK RECOVERY FOR A DATA RECEIVING UNIT

(71) Applicant: International Business Machines Corporation, Armonk, NY (US)

(72) Inventors: Peter Buchmann, Wald (CH); Pier Andrea Francese, Adliswil (CH); Thomas H. Toifl, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/548,087

(22) Filed: Nov. 19, 2014

(65) Prior Publication Data

US 2015/0146830 A1 May 28, 2015

(30) Foreign Application Priority Data

Nov. 28, 2013 (GB) .................................. 1321031.5

(51) Int. Cl.
*H04L 7/00* (2006.01)
*H03L 7/00* (2006.01)
*H04L 7/033* (2006.01)

(52) U.S. Cl.
CPC ................ *H03L 7/00* (2013.01); *H04L 7/0025* (2013.01); *H04L 7/0337* (2013.01)

(58) Field of Classification Search
None
See application file for complete search history.

(56) References Cited

U.S. PATENT DOCUMENTS

| | | | |
|---|---|---|---|
| 7,724,862 B2 | 5/2010 | Menolfi et al. | |
| 8,050,376 B2 | 11/2011 | Liu et al. | |
| 8,138,840 B2 | 3/2012 | Ainspan et al. | |
| 8,239,579 B2 | 8/2012 | Tang et al. | |
| 8,269,533 B2 | 9/2012 | Maheshwari et al. | |
| 2005/0195863 A1* | 9/2005 | Cranford et al. | 370/516 |
| 2006/0146959 A1 | 7/2006 | Aziz et al. | |
| 2008/0056426 A1 | 3/2008 | Si et al. | |
| 2008/0075220 A1 | 3/2008 | Honken et al. | |
| 2009/0002082 A1* | 1/2009 | Menolfi et al. | 331/57 |
| 2012/0109356 A1 | 5/2012 | Kong et al. | |
| 2013/0300470 A1* | 11/2013 | Mohajeri et al. | 327/157 |

OTHER PUBLICATIONS

Reutemann et al., "A 4.5 mW/Gb/s 6.4 Gb/s 22+1-Lane Source Synchronous Receiver Core With Optional Cleanup PLL in 65 nm CMOS", IEEE Journal of Solid-State Circuits, vol. 45, No. 12, Dec. 2010, pp. 2850-2860. DOI: 10.1109/JSSC.2010.2077350.
Song et al., "A 1.0-4.0—Gb/s All-Digital CDR With 1.0-ps. Period Resolution DCO and Adaptive Proportional Gain Control", IEEE Journal of Solid-State Circuits, vol. 46, No. 2, Feb. 2011, pp. 424-434. DOI: 10.1109/JSSC.2010.2082272.
International Search Report dated May 29, 2014 for International Application No. GB1321031.5, 3 pages.
GB Application 1321031.5, entitled "Clock recovery method and apparatus", filed Nov. 28, 2013.

\* cited by examiner

*Primary Examiner* — Adolf Dsouza
(74) *Attorney, Agent, or Firm* — Nicholas D. Bowman; Jeff Tang

(57) ABSTRACT

Clock recovery for a data receiving unit is disclosed. Clock recovery can include obtaining an early/late signal from an incoming data stream. The early/late signal indicates if a set of one or more data samples of the incoming data stream tends to be earlier or later than an edge of a phase-rotated clock signal provided depending on a phase offset value. Clock recovery can include updating a phase rotation counter value in response to the early/late signal. Clock recovery can include determining the phase offset value depending on a rounded phase rotation counter value. The phase offset value can be further determined by selecting one of a set of options including maintaining, increasing, or decreasing the rounded phase rotation counter value. The selecting is performed depending on the early/late signal and depending on the phase rotation counter value.

18 Claims, 2 Drawing Sheets

CLOCK RECOVERY FOR A DATA RECEIVING UNIT

CROSS-REFERENCE TO RELATED APPLICATIONS

This application claims priority to United Kingdom Patent Application No. 1321031.5, filed Nov. 28, 2013, which is incorporated herein in its entirety.

BACKGROUND

The present invention relates to techniques for clock recovery comprising a digital phase-locked loop circuitry and a plurality of phase rotators.

Clock recovery is an important technique to be used on the receiving side of electronic units. It is generally applied on received high-speed serial data streams which are transmitted without any reference clock signal.

New I/O standards applying clock recovery, such as PCI express generation 3 and 4, impose stringent requirements on the clock recovery jitter tolerance specifications. In some approaches, the circuitry for recovering clock signals uses a digital tracking loop and a phase rotator. A phase offset to be set by the phase rotator is tuned by the digital tracking loop depending on a relative phase shift of the incoming data with respect to a basic clock signal, wherein the phase rotator applies the phase offset to the basic clock signal to latch the incoming data stream. The tracking loop can generally be implemented as second order digital control loop, hence having a proportional and integral path to track phase and frequency, respectively.

However, in some instances, a clock recovery unit requires processing time before a timing of an analyzed data sample of an incoming data stream has its effect on a phase rotation of the basic clock signal. In some instances, the latency of a clock recovery unit is about several clock cycles. This latency has a negative effect on the stability of the phase control loop, which manifests itself as jitter peaking in jitter tolerance measurements.

Document U.S. Pat. No. 8,138,840 B2 discloses a method for controlling jitter in a digital phase-locked loop. The digital phase-locked loop comprises an adjustable delay line configured to receive at least one of a reference clock signal and a feedback clock signal as an input and to output a dithered signal, a phase and frequency detector configured to compare the reference clock signal and the feedback clock signal, wherein at least one of the clock signals is the dithered signal, to determine phase and frequency differences between the clock signals, and a digitally controlled oscillator configured to receive early or late determinations from the phase and frequency detector to adjust an output in accordance therewith, wherein the dithered signal distributes a jitter response to enhance the overall operation of the digital phase-locked loop.

Document US 2008/0056426 A1 discloses a clock recovery method and apparatus providing the flexibility to choose between a low jitter mode and a low latency mode. This is achieved by switching between a retime mode and a resync mode, wherein data can be synchronized or retransmitted with simultaneously reduced latency and jitter.

Document U.S. Pat. No. 7,724,862 B2 discloses an adjustable phase-locked loop with an adjustable phase shift. The phase-locked loop comprises a voltage-controlled oscillator configured to generate multiple phase-shifted output signals, multiple phase detectors configured to determine phase differences between the phase-shifted output signals and a reference clock, and a weighting device configured to weight the phase differences and generate a control signal for the voltage-controlled oscillator. Thereby, the function of phase generation and phase rotation is combined in a single compact unit.

Document Reutemann, R. et al., "A 4.5 MW/GB/S 6.4 GB/S 22+1-LANE SOURCE SYNCHRONOUS RECEIVER CORE WITH OPTIONAL CLEANUP PLL IN 65 NM CMOS", IEEE Journal of Solid-State Circuits, Volume: 45, Issue: 12, December 2010 discloses a low-power source-synchronous link receiver macro for data rates of 3.2-6.4 Gb/s. A pulsed clock recovery with programmable bandwidth is implemented to save power in the clock recovery. Time dithering is applied to the clock recovery to avoid notches in the jitter tolerance curve. The receiver clock path incorporates both a clean-up PLL and a polyphase filter for RX clock generation, one of which can be chosen to generate the receive clock.

Document Heesoo Song et al., "A 1.0-4.0-GB/S ALL-DIGITAL CDR WITH 1.0-PS PERIOD RESOLUTION DCO AND ADAPTIVE PROPORTIONAL GAIN CONTROL", IEEE Journal of Solid-State Circuits, Volume: 46, Issue: 2, February 2011, discloses an all-digital recovery circuit for multigigabit/s operation. The proposed digitally controlled oscillator incorporating a supply-controlled ring oscillator with a digitally controlled resistor generates wide-frequency-range multiphase clocks with fine resolution. With an adaptive proportional gain controller, which continuously adjusts a proportional gain, the proposed digital recovery circuit recovers data with a low-jitter clock and tracks large-input jitter rapidly, resulting in enhanced jitter performance. A digital frequency acquisition loop with a proportional control greatly reduces acquisition time.

SUMMARY

According to embodiments of the present disclosure, a method of clock recovery for a data receiving unit is disclosed. In embodiments, the method includes obtaining an early/late signal from an incoming data stream, wherein the early/late signal indicates if a set of one or more data samples of the incoming data stream tends to be earlier or later than an edge of a phase-rotated clock signal provided depending on a phase offset value. In embodiments, the method includes updating a phase rotation counter value in response to the early/late signal. In embodiments, the method can includes determining the phase offset value depending on a rounded phase rotation counter value. In embodiments, the phase offset value is further determined by selecting one of a set of options including maintaining, increasing, or decreasing the rounded phase rotation counter value, wherein the selecting is performed depending on the early/late signal and depending on the phase rotation counter value.

According to embodiments of the present disclosure a clock recovery apparatus for a data receiving unit is disclosed. In embodiments the apparatus includes an early/late aggregation block for obtaining an early/late signal from an incoming data stream, wherein the early/late signal indicates whether a set of one or more data samples of the incoming data stream tends to be earlier or later than an edge of a phase-rotated clock signal provided depending on a phase offset value. In embodiments, the apparatus includes a means for updating a phase rotation counter value in response to the early/late signal. In embodiments, the apparatus includes a phase rotation counter block for determining the phase rotation counter value. In embodiments, the apparatus includes a means for determining the phase offset value depending on a rounded phase rotation counter value. In embodiments, the apparatus includes a look-ahead unit which is configured to further determine the phase offset value by selecting one of the set of options including maintaining, increasing or decreasing the rounded phase rotation counter value wherein the selecting is performed depending on the early/late signal and depending on the phase rotation counter value.

According to embodiments of the present disclosure, a method of clock recovery for a data receiving unit is disclosed. In embodiments, the method includes receiving an early/late signal from an incoming data stream, wherein the early/late signal indicates whether a set of one or more data samples of the incoming data stream is earlier than or later than an edge of a phase-rotated clock signal, the phase-rotated clock signal provided depending on a phase offset value. In embodiments, the method includes updating a phase rotation counter value in response to receiving the early/late signal. In embodiments, the method includes determining a rounded phase rotation counter value depending on the phase rotation counter value and the early/late signal. In embodiments, the method includes determining the phase offset value depending on the rounded phase rotation counter value.

BRIEF DESCRIPTION OF THE SEVERAL VIEWS OF THE DRAWINGS

Embodiments will be described in more detail in conjunction with the accompanying drawings, in which.

DETAILED DESCRIPTION

Figure 1:
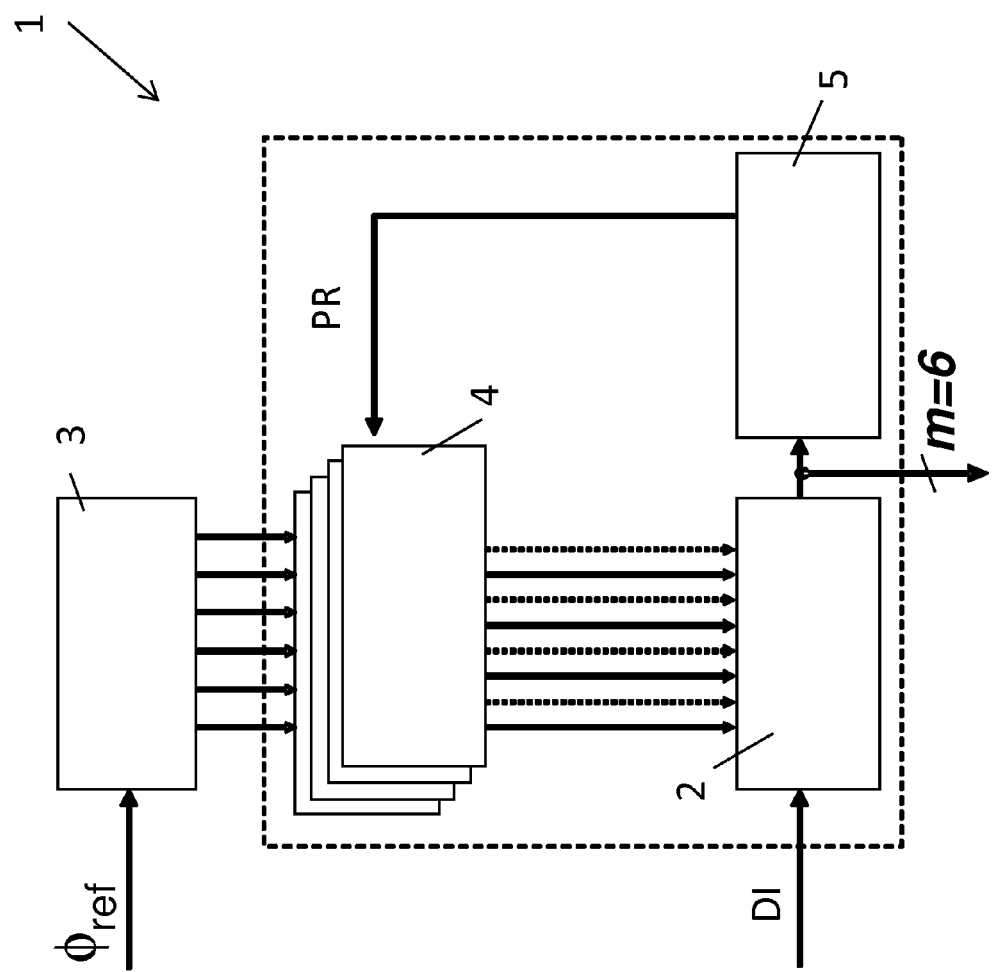
FIG. 1 shows a block diagram of a general data receiving unit for high-speed data streams.

According to embodiments of the present disclosure, a clock recovery method for a data receiving unit is provided. In embodiments, the method includes obtaining an early/late signal from an incoming data stream, wherein the early/late signal indicates if a set of one or more data samples of the incoming data stream tends to be earlier or later than an edge of a phase-rotated clock signal provided depending on a phase offset value. In embodiments, the method includes updating a phase rotation counter value in response to the early/late signal. In embodiments, the method includes determining the phase offset value depending on a rounded phase rotation counter value.

In embodiments, the phase offset value is further determined by selecting one of a set of options including maintaining, increasing or decreasing the rounded phase rotation counter value. In some embodiments, the selecting is performed depending on the early/late signal and depending on the phase rotation counter value.

One idea of a clock data recovery method, according to embodiments of the present disclosure, is to use a look-ahead scheme to determine/manipulate a phase offset value. In embodiments, determining a phase offset value for generating a phase-rotated clock signal depending on an early/late signal obtained as a result of a relation between data samples of an incoming data stream and the phase-rotated clock signal makes use of updating a phase rotation counter. However, in some instances, this requires a processing time of several clock cycles. A look-ahead scheme, according to embodiments of the disclosure, is used to estimate and predict a potential change in the required phase rotation based directly on the early/late signal. In embodiments, this allows for estimation and prediction of a change in the phase offset value before the phase rotation counter has been updated, according to the early/late signal. In embodiments, the timely reaction on an early/late state of incoming data signals allows a pre-computation of whether a change in the phase offset value to be set by the phase rotator is possible to occur or not. In some instances, this allows reduction in the latency of the clock recovery, which consequently decreases the jitter.

Furthermore, in embodiments, the updating of the phase rotation counter value in response to the early/late signal is performed by applying a proportional value to the phase rotation counter value depending on the early/late signal and, by applying an integrator value to the phase rotation counter value. In embodiments, the integrator value is obtained by integrating a provided integrator value depending on the early/late signal.

Moreover, in some instances, the early/late signal is obtained by applying a majority voting method to a number of data samples of the incoming data stream.

According to embodiments, the phase offset value can correspond to the rounded phase rotation counter value, wherein the selecting of one of the set of options including maintaining, increasing or decreasing the rounded phase rotation counter value is performed depending on the early/late signal and depending on a rounding error of the rounded phase rotation counter value.

Furthermore, in some instances, a first time for processing the steps of updating the phase rotation counter value in response to the early/late signal and of determining the phase offset value depending on a rounded phase rotation counter value is longer than a second time for processing the step of selecting one of the set of options including maintaining, increasing or decreasing the rounded phase rotation counter value. In embodiments, the selecting is performed depending on the early/late signal and depending on the phase rotation counter value.

In embodiments, the rounded phase rotation counter value is incremented depending on whether the rounding error of the rounding of the phase rotation counter value is within a predetermined range and the early/late signal indicates that the set of one or more data samples of the incoming data stream tends to be later than an edge of the phase-rotated clock signal. In embodiments, the rounded phase rotation counter value is decremented depending on whether the rounding error of the rounding of the phase rotation counter value is within a further predetermined range and the early/late signal indicates that the set of one or more data samples of the incoming data stream tends to be later than an edge of the phase-rotated clock signal.

In embodiments, a number of consecutive early/late signals can further be considered, wherein the rounded phase rotation counter value is incremented if the rounding error of the rounding of the phase rotation counter value is within a range which is determined by the number of early/late signals each indicating that the set of one or more data samples of the incoming data stream tends to be later than an edge of the phase-rotated clock signal. In embodiments, the rounded phase rotation counter value is decremented if the rounding error of the rounding of the phase rotation counter value is within a range which is determined by the number of early/late signals each indicating that the set of one or more data samples of the incoming data stream tends to be earlier than an edge of the phase-rotated clock signal.

In embodiments, the rounded phase rotation counter value corresponds to a value of a number of most significant bits of the phase rotation counter value, wherein the phase offset value corresponds to the value of the most significant bits of the phase rotation counter value which is maintained, incremented or decremented depending on the early/late signal and depending on the value of the least significant bits of the phase rotation counter value.

Moreover, the value of the most significant bits of the phase rotation counter value can be incremented to obtain the phase offset value if the actual early/late signal indicates that the set of one or more data samples of the incoming data stream tends to be later than an edge of the phase-rotated clock signal and the value of the least significant bits of the phase rotation counter value is within a predetermined range. In embodiments, the value of the most significant bits of the phase rotation counter value may be decremented to obtain the phase offset value if the actual early/late signal indicates that the set of one or more data samples of the incoming data stream tends to be earlier than an edge of the phase-rotated clock signal and the value of the least significant bits of the phase rotation counter value is within a predetermined range.

FIG. 1 schematically shows a data receiving unit 1 applied for receiving and latching high-speed data streams, e.g. as received via multi-Gbps serial links such as IEEE 802.3AE XAUI, PCI-Express, Fiber Channel, and Rapid I/O. In detail, a data stream DI containing data samples is received in corresponding sampling latches in a sampling latch unit 2, wherein sampling is performed by generating a number of uniformly spaced clock signals by applying a number of fixed phase offsets to a provided basic clock signal $\phi_{ref}$. In embodiments, the provided basic clock signal $\phi_{ref}$ has a frequency which corresponds to an integer fraction 1/N (N>=1) of the frequency of the data samples of the incoming data stream DI.

The uniformly spaced clock signals are generated by using a multi-phase generator 3. The uniformly spaced clock signals are supplied to a phase rotation unit 4 which is adapted to offset the uniformly spaced clock signals depending on a phase offset value PR. The phase rotation unit 4 is configured to generate a number of phase-rotated clock signals depending on the digital phase offset value PR supplied by a clock recovery unit 5. The clock recovery unit 5 determines the phase offset value PR depending on an evaluation of the data samples of the incoming data stream DI latched in the sampling latches 2.

The timing information is extracted from the digital data samples of the incoming data stream DI. This can be performed by oversampling the data stream by a factor of two, hence adding specific data samples at the edge position of the eye (Alexander-type phase detector). In some embodiments, this is performed by extracting the timing information in the center of the respective data eyes (Muller-Mueller-type phase detector.) In both cases the timing information per symbol is either late, early or neither early nor late. The early/late information indicates if one respective data sample has arrived earlier or later with respect to a respective clock edge of the phase-rotated clock signal used for latching the data sample into the corresponding sampling latch of the sampling latch unit 2. Depending on the early/late information related the incoming data stream DI, the phase offset value PR is determined in the clock recovery unit 5.

In embodiments, the clock recovery unit 5 is implemented as a digital circuitry, so that it can be integrated in standard CMOS logic.

Figure 2:
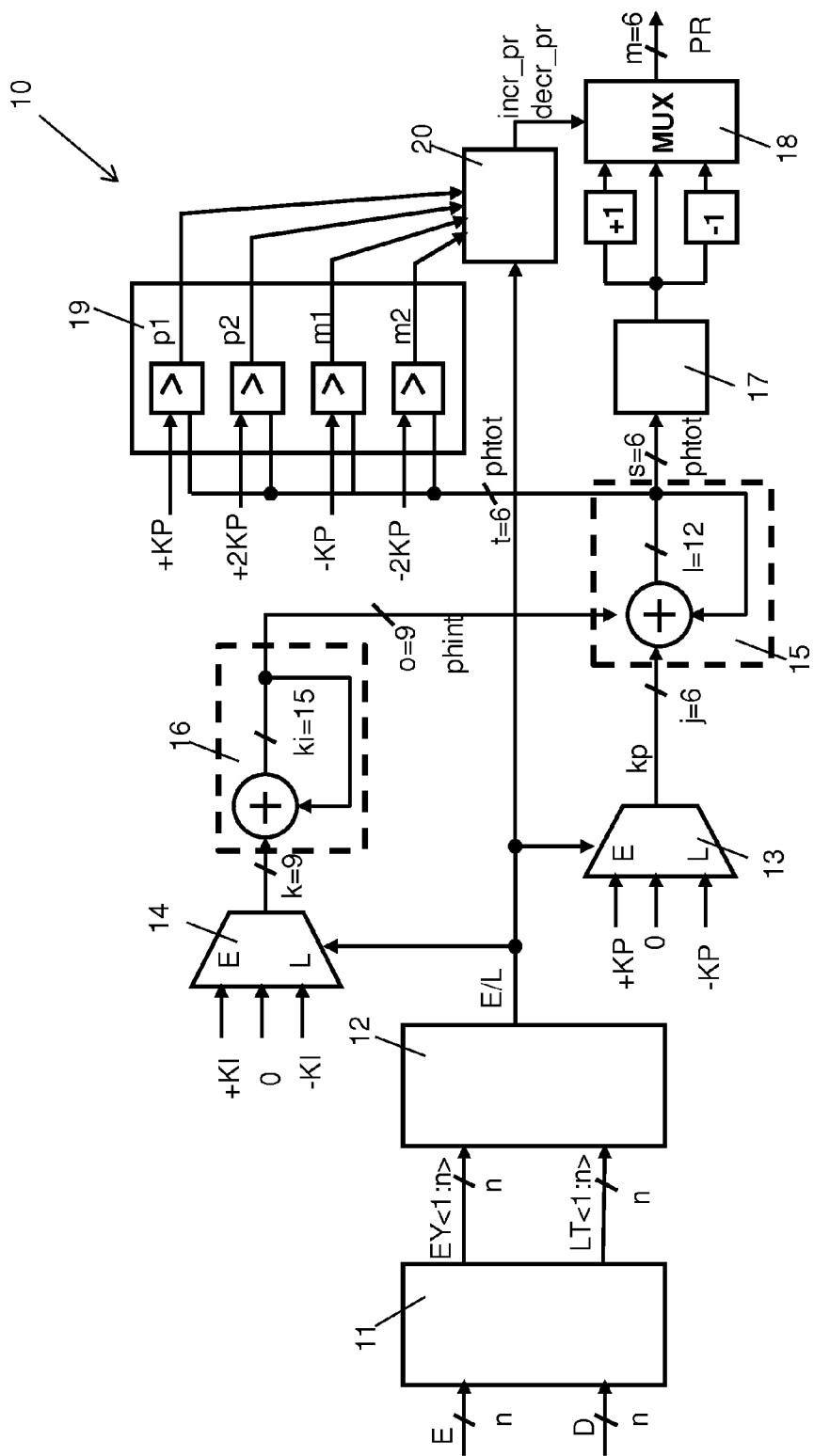
FIG. 2 shows a block diagram of a clock recovery unit.

FIG. 2 schematically shows a block diagram of the clock recovery unit 10 as a more detailed example of the clock recovery unit 5 of the data receiving unit 1. The clock recovery unit 10 analyzes the data samples of the incoming data stream DI and provides a phase offset value PR. The phase offset value PR is provided as an m-bit signal, such as e.g. a 6-bit signal, and is supplied to the phase rotation unit 4 to phase-shift the number of fixedly uniformly spaced clock signals to obtain the phase-rotated clock signals.

The incoming data stream DI may be oversampled by the phase-rotated clock signal. In embodiments, oversampling doubles the number of samples per unit interval compared to the baud rate of the incoming data stream DI. An edge signal with edge bit values E and a data signal with data bit values D are obtained, each of which indicates the value of the data stream at the time of an edge of the respective phase-rotated clock signal which has been generated on the basis of the actual (valid) phase offset value PR. In case the data stream and the clock signal are fully synchronized, the time of a first edge of the phase-rotated clock signal is at the start or end of a data sample, e.g. at the time of a crossing of the eye pattern of the incoming data stream DI, while the time of a second edge (having an opposite direction) of the phase-rotated clock signal is at the time of the eye opening of the eye pattern. In embodiments, by sampling the incoming data stream DI as described above, streams of an edge signal containing the edge bit values E and of a data signal containing the data bit values D are obtained which are provided to an early/late detection block 11.

The data bit values D and edge bit values E are determined by a comparison with the zero value at the time of the respective edge of the actual (valid) phase-rotated clock signal. As high-speed data streams are provided as differential signals, the data bit value D or edge bit value E, respectively, can be obtained by comparing the two signal parts and determining the sign.

The early/late detection block 11 receives indications of the data bit values D and edge bit values E. The data bit values D and the edge bit values E are latched into respective latches of the early/late detection block 11 in sets of n subsequent bits, such as e.g. 8 subsequent bits. The early/late detection block 11 then determines for each detected transition between two subsequent data bit values D whether the edge bit value E corresponds to the value of the preceding data bit or to the value of the subsequent data bit. In embodiments, the early/late detection for the n subsequent data bits is determined as follows:

$$EY<i>=(Di \neq Di+1) \text{ AND } (Di \neq Ei)$$

$$LT<i>=(Di \neq Di+1) \text{ AND } (Di+1 \neq Ei),$$

Wherein EY<i=1 ... n> and LT<i=1 ... n> are signals indicating that an early or late condition has been determined which occurred at the bit position i. The early and late signals EY<i>, LT<i> are then supplied to an early/late aggregation block 12.

The early/late aggregation block 12 is substantially configured to condense the early and late information provided by the early and late signals EY<i> and LT<i> to a two-bit aggregated early/late signal E/L. The two-bit aggregated early/late signal E/L is then be used for determining the phase offset value PR. In an example implementation the aggregation in the early/late aggregation block 12 is performed using a tree-style majority voting.

A tree-style majority voting recursively votes on groups of 2 bits, which is easy to implement. A (non-tree style) majority voting would first have to add up the total number of earlies and lates (in a group of e.g. N=8) bits, and then compare the two numbers. In some instances, this is harder to implement and requires more computation time affecting overall latency.

An exemplary logic to determine the two-bit aggregated early/late signal E/L can be given as follows:

$$ey12 = (EY{<}1{>}\&!(LT{<}2{>})) + (EY{<}2{>}\&!(LT{<}1{>}))$$

$$lt12 = (LT{<}1{>}\&!(EY{<}2{>})) + (LT{<}2{>}\&!(EY{<}1{>}))$$

$$ey34 = (EY{<}3{>}\&!(LT{<}4{>})) + (EY{<}4{>}\&!(LT{<}3{>}))$$

$$lt34 = (LT{<}3{>}\&!(EY{<}4{>})) + (LT{<}4{>}\&!(EY{<}3{>}))$$

$$ey56 = (EY{<}5{>}\&!(LT{<}6{>})) + (EY{<}6{>}\&!(LT{<}5{>}))$$

$$lt56 = (LT{<}5{>}\&!(EY{<}6{>})) + (LT{<}6{>}\&!(EY{<}5{>}))$$

$$ey78 = (EY{<}7{>}\&!(LT{<}8{>})) + (EY{<}8{>}\&!(LT{<}7{>}))$$

$$lt78 = (LT{<}7{>}\&!(EY{<}8{>})) + (LT{<}8{>}\&!(EY{<}7{>}))$$

$$ey1234 = (ey12\&!(lt34)) + (ey34\&!(lt12))$$

$$lt1234 = (lt12\&!(ey34)) + (lt34\&!(ey12))$$

$$ey5678 = (ey56\&!(lt78)) + (ey78\&!(lt56)$$

$$lt5678 = (lt67\&!(ey78)) + (lt78\&!(ey56))$$

$$E = (ey1234\&!(lt5678)) + (ey5678\&!(lt1234))$$

$$L = (lt1234\&!(ey5678)) + (lt5678\&!(ey1234))$$

In embodiments, the aggregation of the early and late signals $EY{<}i=1\ldots n{>}$, $LT{<}i=1\ldots n{>}$ is achieved by performing a tree-style majority voting on the number of detected early data samples and detected late data samples. In some embodiments, the number of early signals $EY{<}i{>}$ and late signals $LT{<}i{>}$ in the group of n bits may be counted and the two count numbers may be compared to derive the aggregated E/L signal.

The two-bit aggregated early/late signal E/L is supplied to a first multiplexer 13 and to a second multiplexer 14. The first multiplexer 13 outputs a preset proportional constant +KP if the two-bit aggregated early/late signal E/L indicates that the early bit E is set. In some embodiments, the first multiplexer 13 outputs a negative proportional constant −KP if the two-bit aggregated early/late signal E/L indicates that the late bit L is set. In some embodiments, the first multiplexer 13 outputs a value of 0 if neither the early bit E nor the late bit L nor both the early bit E and the late bit L are set. The output of the first multiplexer 13 is supplied to a phase rotation counter block 15, so that depending on the two-bit aggregated early/late signal E/L either the value of 0 or the proportional constant +KP or the negative proportional constant −KP is supplied to a first input of the counter block 15. The output of the first multiplexer 13 corresponds to a selected proportional value kp which has a resolution of j bits, wherein j=6 in some embodiments.

The two-bit aggregated early/late signal E/L is supplied to the second multiplexer 14. The second multiplexer 14 outputs a preset positive integrator constant +KI if the two-bit aggregated early/late signal E/L indicates that the early bit E is set. In some embodiments, the second multiplexer 14 outputs a negative integrator constant −KI if the two-bit aggregated early/late signal E/L indicates that the late bit L is set. In some embodiments, the second multiplexer 14 outputs a value of 0 if neither the early bit E nor the late bit L nor both the early bit E and the late bit L are set. The resolution of the positive integrator constant and the negative integrator constant can be k bits, such as k=9.

The output of the second multiplexer 14 is supplied to an integrator block 16, so that depending on the two-bit aggregated early/late signal E/L either the value of 0 or the given positive integrator constant +KI or the given negative integrator constant −KI is supplied to the integrator block 16 where the positive or negative integrator constant +/−KI are accumulated. The output of the integrator block 16 is an integrator value phint with a k-bit resolution, wherein in the present embodiment k=15. The o MSBs of the output of the integrator block 16 providing a rounded integral component of the loop filter, are added to the counter block 15, wherein o=9 in some embodiments. Relative to the proportional path of the control loop, the integral component of the loop filter is insensitive to latency, and hence no reduction in latency is required. The contributions from the proportional path and the integral path of the loop filter are added in the counter block 15, which has a resolution of t bits, wherein t=12 in some embodiments. The phase rotation counter block 15 then provides a phase rotation counter value phtot.

The phase rotation counter value phtot of the counter block 15 may be forwarded to a binary-to-gray code conversion block 17 which is configured to convert the number w of the most significant bits (w=6 for example) of the binary counter value supplied by the counter block 15 into a gray-coded value which is provided to a third multiplexer 18. In some instances, the counter block 15 may provide a rounded phase rotation counter value phtot e.g. in form of the most significant bits of the phase rotation counter value phtot.

The phase rotation counter value phtot of the counter block 15 is further supplied to a range detection logic block 19 which is configured to generate and to output an indication about the range of the counter value in the counter block 15. In particular, the least significant bits of the counter value phtot indicate whether or not a change of the most significant bits of the counter value phtot can be expected by the actually incoming two-bit aggregated early/late signal E/L.

In embodiments, the number of most significant bits of the counter value phtot is 6 and the number of least significant bits of the counter value is 6. However, different values can be respectively chosen for the number of most significant bits and the number of least significant bits of the counter value phtot output by the counter block 15.

The range detection logic block 19 is configured to analyze the counter value phtot and to determine if the counter value phtot is close to a value where a change of the counter value phtot might result in a change of the value of the most significant bits of the counter value phtot. In particular, the range detection logic block 19 gives an indication whether the counter value phtot has a value within a range where an incoming early/late information provided by the early/late aggregation block 12 might result in a change of the lowest bit of the most significant bits of the counter value phtot, which substantially is used to generate the phase offset value PR or substantially corresponds to the phase offset value PR. Thus, the range detection block outputs conditional jump information, in the sense that a change of the phase offset value PR would be performed if a single or multiple early or late signals were detected.

As the change potentially caused by the incoming early/late information provided by the early/late aggregation block 12 has to propagate through the first and second multiplexer 13, 14 and the counter block 15, the effect of a respective actual early/late information on the output phase offset value PR is delayed.

If in one calculation cycle, either from the first multiplexer 13 or from the integrator block 16, a value can be expected which might result in that the counter value of the counter block 15 exhibits a bit change in the most significant bits of the counter value, then this shall be indicated by the range detection logic block 19. In the range detection logic block 19, it is therefore determined if the least significant bits of the counter block 15 indicate a value in the range between 0 and +KP, which is indicated by the first positive range indicator signal p1. If it is determined in the range detection logic block 19 that the least significant bits of the counter value indicate a value between −KP and 0, then the first negative range indicator signal m1 is set.

Depending on the delay of the processing of the early/late signal E/L from the early/late aggregation block 12 until the output of the third multiplexer 18, it can be further determined if the least significant bits of the counter value are in a further range between 0 and +2KP or 0 and −2KP to cover cases in which two consecutive early indications or two consecutive late indications are provided by the early/late aggregation block 12. If the counter value phtot is in the further range between 0 and +2KP or 0 and −2KP, the second positive/negative range indicator signals p2, m2 are set, respectively. In some instances, the number of ranges per sign range of the counter value phtot to be considered by the range detection logic block 19 can be set to the number q of cycles required to propagate the early/late information to the third multiplexer 18. In embodiments, if the value of the least significant bits of the counter value phtot is in the specific range of the positive/negative range, the indicator signal is set to "1".

Hence, the positive range indicator signals p1, p2, . . . , pq, and the negative range detector signals m1, m2, . . . , mq allow to indicate the range of the value of the least significant bits of the counter value. The positive and negative range indicator signals p1, p2, . . . , pq, m1, m2, . . . , mq are supplied to a jump logic unit 20 which is configured to generate an increment control signal incr_pr and a decrement control signal decr_pr to be supplied to the third multiplexer 18.

In case there is a clock delay of between 2 and 3 clock cycles between the early/late aggregation block 12 and the output of the counter block 15, wherein the first and second positive range indicator signals p1, p2 and the first and second negative range indicator signals m1, m2 are provided as above, the increment control signal incr_pr and the decrement control signal decr_pr can be obtained as follows:

$$incr\_pr=(L0\&L1)\& \ m2+(L1\&!E0+L0\&!E1)\&m1$$

$$decr\_pr=(E0\&E1)\& \ p2+(E0\&!L1+E1\&!L0)\&p1,$$

wherein L0 corresponds to a "LATE" of the early/late signal E/L from the previous cycle, L1 corresponds to a "LATE" of the early/late signal E/L from the current cycle, E0 corresponds to an "EARLY" of the early/late signal E/L from the previous cycle, and E1 corresponds to an "EARLY" of the early/late signal E/L from the current cycle.

For example, if the value of the least significant bits of the counter value is in a range of 0 . . . −2KP, as indicated by the second negative range indicator signal m2, the increment control signal incr_pr is only set if two subsequent "LATE"s L0 and L1 are set. Furthermore, the increment control signal incr_pr is set if the value of the least significant bits of the counter value is in the first negative range of 0 . . . −KP, provided that none of the regarded "LATE"s L0, L1 is negated by an "EARLY" E0, E1 of a subsequent or preceding early/late signal E/L.

In embodiments, if the value of the least significant bits of the counter value is in a range of 0 . . . +2KP, which is indicated by the second positive range indicator signal p2, the decrement control signal decr_pr is only set if two subsequent "EARLY"s E0 and E1 are set. Furthermore, the decrement control signal decr_pr is set if the value of the least significant bits of the counter value is in the first positive range of 0 . . . +KP, provided that none of the regarded "EARLY"s E0, E1 is negated by an "LATE" L0, L1 of a subsequent or preceding early/late signal E/L.

The increment control signal incr_pr and the decrement control signal decr_pr are supplied to the third multiplexer 18 where the gray-coded phase rotation counter value is incremented by an increment value, such as "+1", if the increment control signal incr_pr is set or decremented by a decrement value, such as "−1", if the decrement control signal decr_pr is set. The gray-coded phase rotation counter value remains unchanged if both the increase control signal incr_pr and the decrement control signal decr_pr have not been set. In some embodiments, an adder is provided to the third multiplexer 18 which adds to the gray-coded phase rotation counter value a value which is determined as "+1", "−1" or "0" which is selected by the increment control signal incr_pr and the decrement control signal decr_pr, respectively.

In embodiments, the function of the range detection logic block 19 and the jump logic block 20, which together form a look-ahead unit, is to look forward with respect to the actually incoming early/late signal E/L output by the early/late aggregation block 12 and to increment or decrement the phase offset value PR (gray-coded phase rotation counter value) before the respective "EARLY" or "LATE" of the early/late signal E/L can have an effect on the phase offset value PR. In some embodiments, if the output of the counter block 15 is delayed by one or more block cycles, the effect of the early/late signal E/L on the phase offset value PR is delayed as well. Due to the concept of the range detection logic block 19 and the jump logic block 20, the incrementation and decrementation, respectively, are restricted to the respective clock cycle and calculated separately for each clock cycle, so that a phase offset value PR incremented or decremented by the jump logic unit 20 has no accumulating effect on the phase offset value PR.

What is claimed is:

1. A method of clock recovery for a data receiving unit, comprising:
    obtaining an early/late signal from an incoming data stream, wherein the early/late signal indicates if a set of one or more data samples of the incoming data stream tends to be earlier or later than an edge of a phase-rotated clock signal provided depending on a phase offset value;
    updating a phase rotation counter value in response to the early/late signal; and
    determining the phase offset value depending on a rounded phase rotation counter value;
    wherein the phase offset value is further determined by selecting one of a set of options including maintaining, increasing, and decreasing the rounded phase rotation counter value, wherein the selecting is performed depending on the early/late signal and depending on the phase rotation counter value, and
    wherein the rounded phase rotation counter value corresponds to a value of a number of most significant bits of the phase rotation counter value, wherein the phase offset value corresponds to the value of the number of the most significant bits of the phase rotation counter value which is maintained, incremented or decremented depending on the early/late signal and depending on a value of a number of least significant bits of the phase rotation counter value.

2. The method according to claim 1, wherein the updating of the phase rotation counter value in response to the early/late signal is performed by applying a proportional value to the phase rotation counter value depending on the early/late signal and, by applying an integrator value to the phase rotation counter value, wherein the integrator value is obtained by integrating a provided integrator value depending on the early/late signal.

3. The method according to claim 1, wherein the early/late signal is obtained by applying a majority voting method on a number of data samples of the incoming data stream.

4. The method according to claim 1, wherein the phase offset value corresponds to the rounded phase rotation counter value, wherein the selecting of one of the set of options including maintaining, increasing, or decreasing the rounded phase rotation counter value is performed depending on the early/late signal and depending on a rounding error of the rounded phase rotation counter value.

5. The method according to claim 1, wherein the value of the number of the most significant bits of the phase rotation counter value is incremented to obtain the phase offset value if the early/late signal indicates that the set of one or more data samples of the incoming data stream tends to be later than the edge of the phase-rotated clock signal and the value of the number of the least significant bits of the phase rotation counter value is within a predetermined range.

6. The method according to claim 5, wherein the value of the number of the most significant bits of the phase rotation counter value is decremented to obtain the phase offset value if the early/late signal indicates that the set of one or more data samples of the incoming data stream tends to be earlier than the edge of the phase-rotated clock signal and the value of the number of the least significant bits of the phase rotation counter value is within a further predetermined range.

7. The method according to claim 1, wherein a first time for updating the phase rotation counter value in response to the early/late signal and determining the phase offset value depending on the rounded phase rotation counter value is longer than a second time for selecting one of the set of options including maintaining, increasing, or decreasing the rounded phase rotation counter value, wherein the selecting is performed depending on the early/late signal and depending on the phase rotation counter value.

8. The method according to claim 7, wherein the rounded phase rotation counter value is incremented depending on whether a rounding error of the rounded phase rotation counter value is within a predetermined range and the early/late signal indicates that the set of one or more data samples of the incoming data stream tends to be later than the edge of the phase-rotated clock signal.

9. The method according to claim 8, wherein the rounded phase rotation counter value is decremented depending on whether the rounding error of the rounded phase rotation counter value is within a further predetermined range and the early/late signal indicates that the set of one or more data samples of the incoming data stream tends to be later than the edge of the phase-rotated clock signal.

10. The method according to claim 7, wherein a number of consecutive early/late signals are considered, wherein the rounded phase rotation counter value is incremented if a rounding error of the rounded phase rotation counter value is within a range which is determined by the number of early/late signals each indicating that the set of one or more data samples of the incoming data stream tends to be later than the edge of the phase-rotated clock signal.

11. The method according to claim 10, wherein the rounded phase rotation counter value is decremented if the rounding error of the rounded phase rotation counter value is within a further range which is determined by the number of early/late signals each indicating that the set of one or more data samples of the incoming data stream tends to be earlier than the edge of the phase-rotated clock signal.

12. A clock recovery apparatus for a data receiving unit, comprising:
an early/late aggregation block configured to obtain an early/late signal from an incoming data stream, wherein the early/late signal indicates whether a set of one or more data samples of the incoming data stream tends to be earlier or later than an edge of a phase-rotated clock signal provided depending on a phase offset value, and
a phase rotation counter block configured to update a phase rotation counter value in response to the early/late signal, configured to determine the phase rotation counter value, and configured to determine the phase offset value depending on a rounded phase rotation counter value; and
a look-ahead unit configured to determine the phase offset value by selecting one of the set of options including maintaining, increasing or decreasing the rounded phase rotation counter value wherein the selecting is performed depending on the early/late signal and depending on the phase rotation counter value, wherein the rounded phase rotation counter value corresponds to a value of a number of most significant bits of the phase rotation counter value, wherein the phase offset value corresponds to the value of the number of the most significant bits of the phase rotation counter value which is maintained, incremented or decremented depending on the early/late signal and depending on a value of a number of least significant bits of the phase rotation counter value.

13. The clock recovery apparatus according to claim 12, wherein the phase rotation counter block is configured to apply a proportional value to the phase rotation counter value depending on the early/late signal and, apply an integrator value to the phase rotation counter value, wherein the integrator value is obtained by an integrator block which is configured to integrate a provided integrator value depending on the early/late signal.

14. The clock recovery apparatus according to claim 12, wherein the early/late aggregation block is configured to obtain the early/late signal by applying a majority voting method on a number of data samples of the incoming data stream.

15. The clock recovery apparatus according to claim 12, wherein the phase offset value corresponds to the rounded phase rotation counter value, wherein the look-ahead unit is further configured to select one of the set of options depending on the early/late signal and depending on a rounding error of the rounded phase rotation counter value.

16. The clock recovery apparatus according to claim 12, wherein the look-ahead unit is further configured to increment the value of the number of the most significant bits of the phase rotation counter value to obtain the phase offset value if the early/late signal indicates that the set of one or more data samples of the incoming data stream tends to be later than the edge of the phase-rotated clock signal and the value of the number of the least significant bits of the phase rotation counter value is within a predetermined range.

17. The clock recovery apparatus according to claim 16, wherein the look-ahead unit is further configured to decrement the value of the number of the most significant bits of the phase rotation counter value to obtain the phase offset value if the early/late signal indicates that the set of one or more data samples of the incoming data stream tends to be earlier than the edge of the phase-rotated clock signal and the value of the number of the least significant bits of the phase rotation counter value is within a further predetermined range.

18. A method of clock recovery for a data receiving unit, comprising:

receiving an early/late signal from an incoming data stream, wherein the early/late signal indicates whether a set of one or more data samples of the incoming data stream is earlier than or later than an edge of a phase-rotated clock signal, the phase-rotated clock signal provided depending on a phase offset value;

updating a phase rotation counter value in response to receiving the early/late signal;

determining a rounded phase rotation counter value depending on the phase rotation counter value and the early/late signal; and determining the phase offset value depending on the rounded phase rotation counter value, wherein a first time for updating the phase rotation counter value in response to receiving the early/late signal and determining the phase offset value depending on the rounded phase rotation counter value is longer than a second time for determining the rounded phase rotation counter value depending on the phase rotation counter value and the early/late signal.

\* \* \* \* \*